(12) United States Patent
Bace (10) Patent No.: US 6,732,329 B2
(45) Date of Patent: May 4, 2004

(54) PROVIDING A HEADER CHECKSUM FOR PACKET DATA COMMUNICATIONS

(75) Inventor: Matthew M. Bace, North Andover, MA (US)

(73) Assignee: Intel Corporation, Santa Clara, CA (US)

( * ) Notice: Subject to any disclaimer, the term of this patent is extended or adjusted under 35 U.S.C. 154(b) by 564 days.

(21) Appl. No.: 09/819,523

(22) Filed: Mar. 27, 2001

(65) Prior Publication Data

US 2002/0184598 A1 Dec. 5, 2002

(51) Int. Cl.[7] .............. H03M 13/00; H04J 3/24
(52) U.S. Cl. .............. 714/807; 370/474
(58) Field of Search ............... 714/712, 758, 714/776, 779, 806, 807, 808; 370/242, 245, 394, 465, 474

(56) References Cited

U.S. PATENT DOCUMENTS

| | | | | |
|---|---|---|---|---|
| 5,050,166 A | * | 9/1991 | Cantoni et al. | 370/473 |
| 5,701,316 A | * | 12/1997 | Alferness et al. | 714/807 |
| 5,745,502 A | * | 4/1998 | Khayrallah et al. | 714/751 |
| 5,935,268 A | * | 8/1999 | Weaver | 714/758 |
| 5,996,113 A | * | 11/1999 | Korn et al. | 714/807 |
| 6,341,129 B1 | * | 1/2002 | Schroeder et al. | 370/354 |
| 2003/0061561 A1 | * | 3/2003 | Rifaat et al. | 714/774 |

FOREIGN PATENT DOCUMENTS

EP  465006 A1 * 1/1992 .......... G06F/11/08

* cited by examiner

Primary Examiner—Albert Decady
Assistant Examiner—Matthew C. Dooley
(74) Attorney, Agent, or Firm—Seth Z. Kalson (57) ABSTRACT

A method and apparatus for providing the header checksum of a data packet.

17 Claims, 4 Drawing Sheets

PROVIDING A HEADER CHECKSUM FOR PACKET DATA COMMUNICATIONS

FIELD

Embodiments of the present invention relate to communication networks, and more particularly, to an apparatus and method for efficiently providing header checksums for data packets.

BACKGROUND

Figure 1:
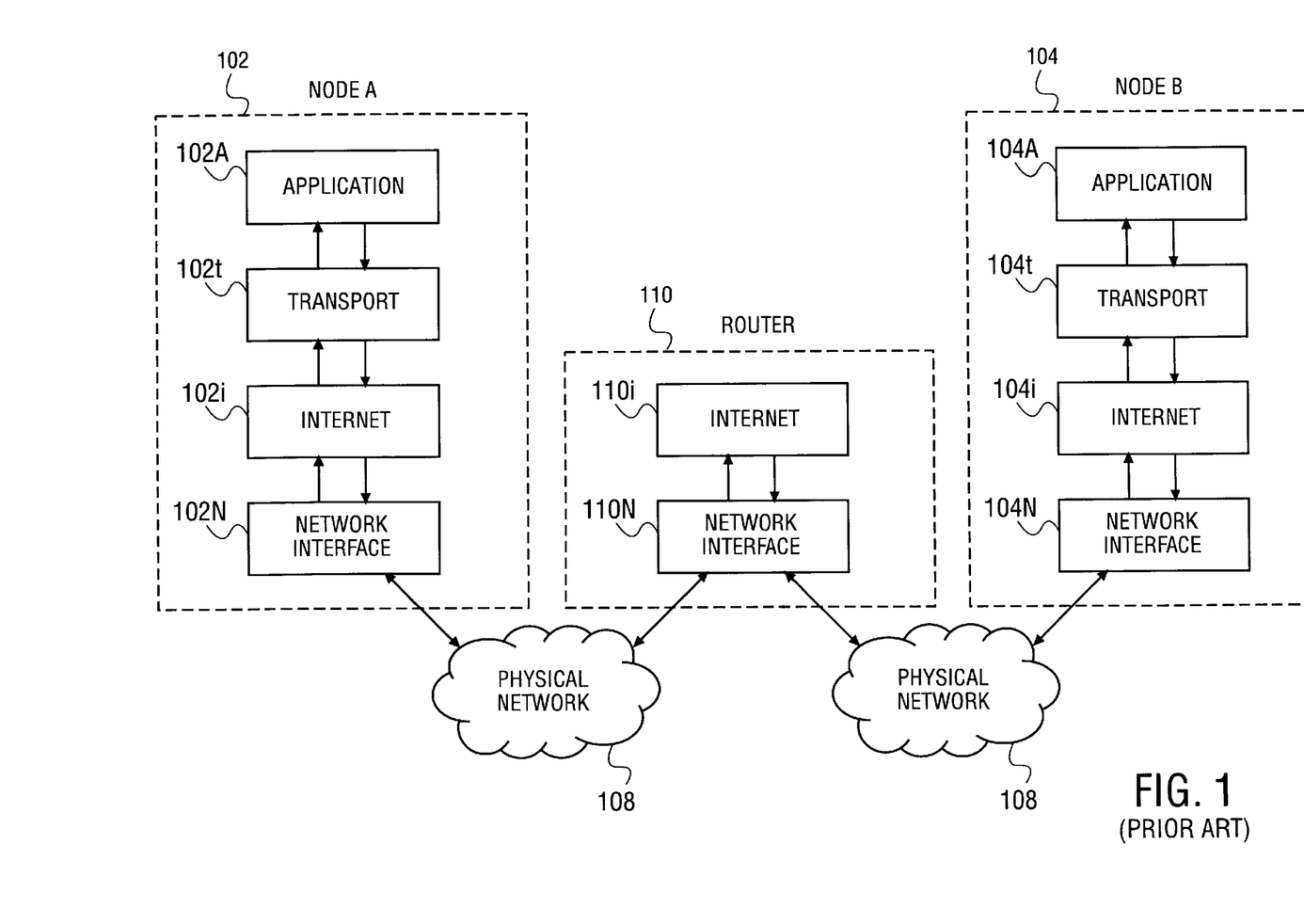
FIG. 1 illustrates a communication network.

FIG. 1 abstracts a communication network, in which node A 102 communicates with node B 104 by sending and receiving data frames. Node A sends a data frame to node B by sending a data frame to router 110 via physical network 106, whereupon router 110 routes the data frame to node B via physical network 108. For simplicity, FIG. 1 illustrates only two nodes and one router communicating via two physical networks, but in practice, an Internet comprises many physical networks, routers, nodes, switches, and other devices. Nodes A and B may be, for example, computers, routers, or other types of processors.

The layered concept of communication is illustrated in FIG. 1, where layers 102$a$, 102$t$, 102$i$, and 102$n$ provide, respectively, application, transport, internet, and network interface functions for node A; layers 104$a$, 104$t$, 104$i$, and 104$n$ provide, respectively, application, transport, internet, and network interface functions for node B; and layers 110$i$ and 110$n$ provide, respectively, internet and network interface functions for router 110. The network interface layer may comprise a data link layer and a PHY layer. The transport layer may implement TCP (Transmission Control Protocol) and the Internet layer may implement IP (Internet Protocol). Various layers, or portions of the layers, may be implemented in hardware or software.

Application layers 102$a$ and 104$a$ are software layers running application programs that may be the source or destination of transmitted data. The transport, internet, and network interface layers pass packets between them. The layered concept employs encapsulation. The transport layer receives data from the application layer, and creates a packet, sometimes called a transport protocol packet. The internet layer encapsulates the transport protocol packet into a larger packet, sometimes called an IP datagram (assuming the internet layer employs IP). The network interface layer encapsulates the IP datagram into a network-specific packet, sometimes called a frame, for transmission over a physical network. See, for example, *Internetworking with TCP/IP*, Douglas E. Corner, Prentice Hall, for a more detailed discussion of communication networks and the layered concept. For simplicity, frames and datagrams may be referred to as simply packets.

Figure 2:
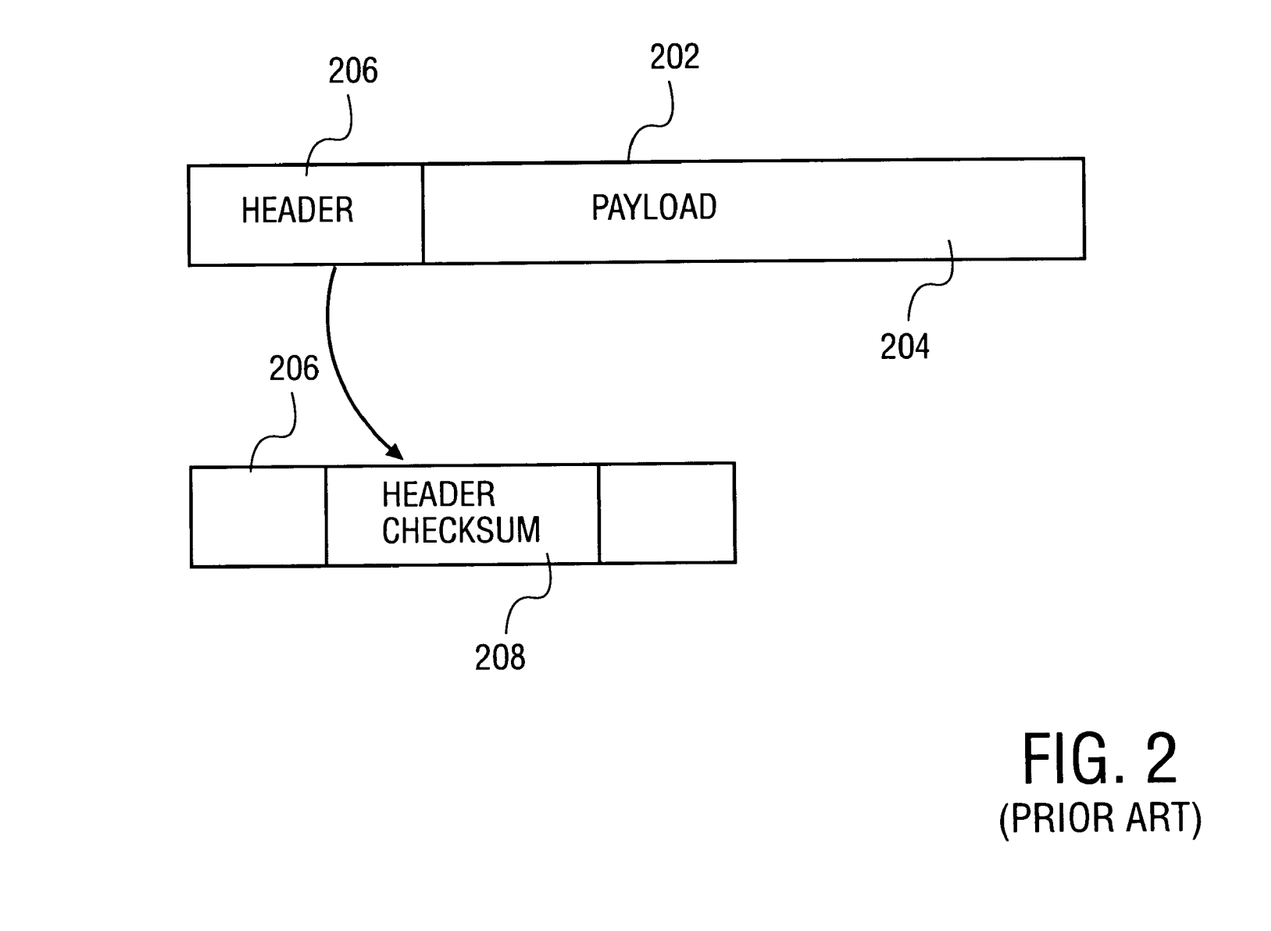
FIG. 2 illustrates a packet with a payload, header, and header checksum.

A simplified illustration of a packet is given in FIG. 2. Packet 202 comprises payload 204 and header 206. Header 206 usually comprises a number of fields, but for simplicity, only checksum field 208 is shown in FIG. 2. A checksum is an integer value, usually computed from a sequence of octets by treating them as integers and computing their sum. Many TCP/IP protocols use a 16-bit checksum computed by one's complement arithmetic. A header checksum may sum over all octets in a header, some of the octets, or all the octets plus additional octets outside the header field. A checksum is used to detect errors. Upon reception of a packet, a checksum on the received packet is performed and compared with the received value of the checksum. If the received and computed checksums do not match, then an error may be indicated.

Checksums are ubiquitous in data packet communications, and efficiently computing checksums is of practical utility and interest.

DESCRIPTION OF EMBODIMENTS

Figure 3:
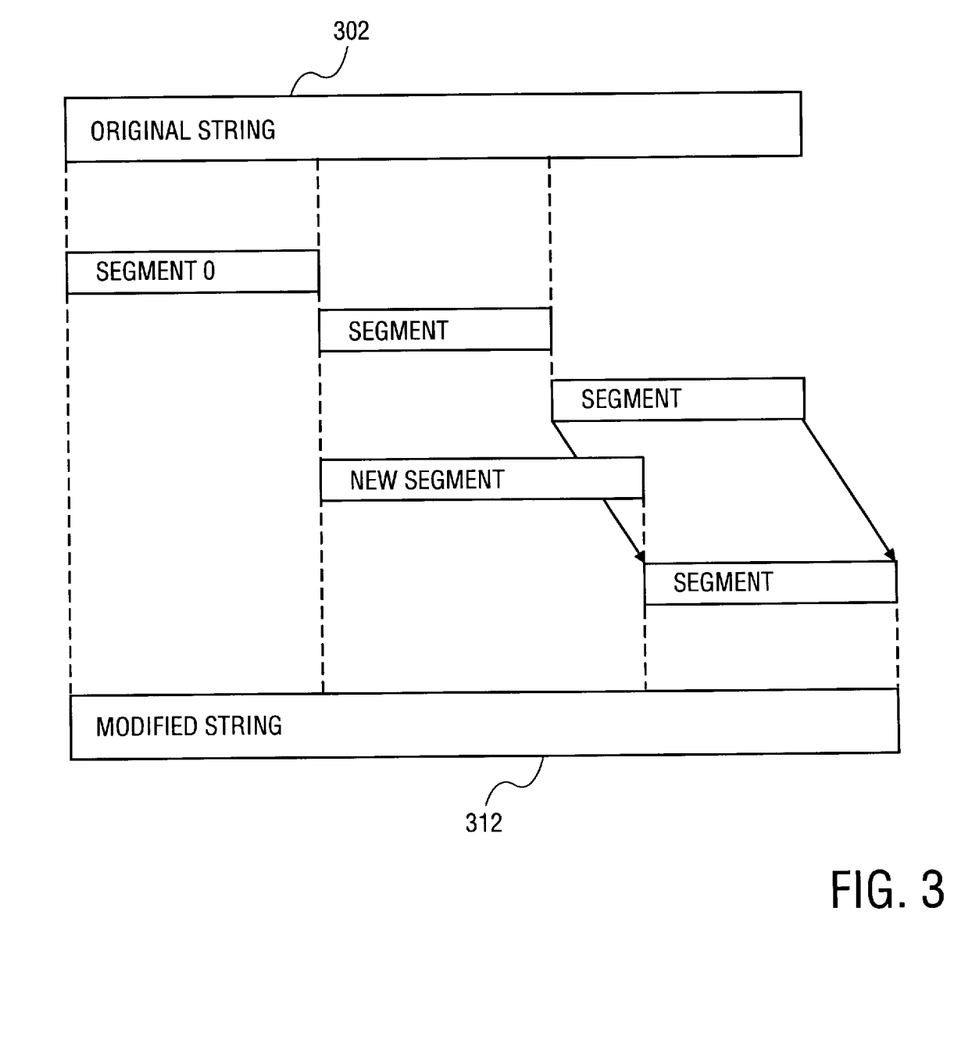
FIG. 3 illustrates a relationship between two octet strings.

In some applications, after a checksum has been computed for a first string of octets having an even number of octets, the checksum for a second string of octets is needed, where the second string is obtained from the first string by replacing a segment of octets in the first string with a new segment of octets, and appending an all zero octet, if needed, so that the second string of octets also has an even number of octets. FIG. 3 illustrates this, where original string 302 comprises three contiguous segments of octets, segment_0, segment _1, and segment_2. Modified string 312 is obtained by replacing segment_1 with new segment_1. In the example of FIG. 3, new segment_1 is longer than segment_1, so that segment_2 is right shifted and modified string 312 is longer than original string 302. For simplicity, FIG. 3 is for the case in which it is not necessary to append an all zero octet to make the second string an even number of octets. The example illustrated in FIG. 3 may occur when a portion of data payload 204 for a first packet is replaced with another portion of data to form a second packet, and the checksum is needed for the header of the second packet.

It is convenient to generalize the example of FIG. 3 by introducing the following notation. Let $\Phi_A$ denote a string of octets comprising three contiguous segments of octets $\phi_0$, $\phi_1$, and $\phi_2$ where the number of octets in $\Phi_A$ is even. Let $\Phi_B$ denote a string of octets derived from $\Phi_A$ in which $\phi_1$ is replaced with a new segment $\hat{\phi}_1$, and the all zero octet is appended to $\phi_2$ if needed, so that $\Phi_B$ has an even number of octets. In the example of FIG. 3, original string 302 may be identified with $\Phi_A$ and modified string 312 may be identified with $\Phi_B$. Suppose the checksum has already been computed for the string $\Phi_A$. By expressing the checksum of $\Phi_B$ in terms of the checksum of $\Phi_A$ and additional quantities, the computation of the checksum of $\Phi_B$ is reduced when compared to computing it directly from $\Phi_B$. This is described later, but first some useful notation and properties are stated below.

The n-bit checksum of a string (sequence) is the ones-complement sum of successive n-bit words in the sequence. The n-bit words may be octets. The checksum addition operator for n-bit words is denoted by $\oplus_n$. Given two n-bit words A and B, the checksum of A and B, denoted by S, is given by $$S = A \oplus_n B = \begin{cases} A + B & \text{if } A + B < 2^n, \\ A + B - (2^n - 1) & \text{if } A + B \geq 2^n. \end{cases}$$

The checksum operator $\oplus_n$ is associative and commutative. For any $x \in \{1, 2, \ldots, 2^n - 1\}$, there exists an inverse of x under $\oplus_n$, denoted as $\hat{x}$, such that $x \oplus_n \hat{x} = 2^n - 1$. This property makes it possible to define a checksum subtraction operator $\ominus_n$, such that $x \ominus_n y = x \oplus_n \hat{y}$. Embodiments below are described within the context of 16-bit words, and for convenience, the shorthand $\oplus$ will be used in place of $\oplus_{16}$ in the present specification.

Let $\alpha_i$ indexed by i denote a octet. The 16-bit words $(\alpha_0 | \alpha_1)$ and $(\alpha_1 | \alpha_0)$ are said to be related by a octet-swap. If for any word x its octet-swap is denoted by x', then for any two words A and B, $$(A \oplus B)' = A' \oplus B'.$$

The above property also applies to a sum of words, so that the octet-swap of a sum of words is equal to the sum of the octet-swapped words. A Checksum String Shifting property is now stated without proof: The 16-bit checksum of the octet sequence $(\alpha_0|\alpha_1|\ldots|\alpha_{N-1}|\alpha_{N-1}|0)$ is the octet-swapped version of the 16-bit checksum of the octet sequence $(0|\alpha_0|\alpha_1|\ldots|\alpha_{N-1}|\alpha_{N-1})$.

Now, suppose a string (sequence) of octets, denoted by $\Phi_A = (\alpha_0|\alpha_1|\ldots|\alpha_{N-1})$, where N is even, has a pre-computed 16-bit checksum $S_A$. Let the string $\Phi_A$ have a head segment $\phi_0$, a middle segment $\phi_1$, and a tail segment $\phi_2$, where the head, middle, and tail segments are strings of octets. That is, $\Phi_A = (\phi_0|\phi_1|\phi_2)$. Suppose the middle segment in the string $\Phi_A$ is replaced by a new segment (string of octets) $\hat{\phi}_1$ to form a new string $\overline{\Phi}_B$ having head segment $\phi_0$, middle segment $\hat{\phi}_1$, and tail segment $\phi_2$. Append the all-zero octet to $\overline{\Phi}_B$ if it has an odd number of octets to form the string $\Phi_B$. If $\overline{\Phi}_B$ has an even number of octets, then set $\Phi_B = \overline{\Phi}_B$. That is $$\Phi_B = \begin{cases} (\phi_0|\hat{\phi}_1|\phi_2) & \text{if number of bytes in } (\phi_0|\hat{\phi}_1|\phi_2) \text{ is even;} \\ (\phi_0|\hat{\phi}_1|\phi_2|0) & \text{if number of bytes in } (\phi_0|\hat{\phi}_1|\phi_2) \text{ is odd.} \end{cases}$$

Let the string $\Phi_B$ have checksum $S_B$. An algorithm will be described below for computing $S_B$ in terms of $S_A$ and the partial checksums of $\phi_0$, $\phi_1$, $\phi_2$, and $\hat{\phi}_1$.

To this end, let x denote a string segment of octets which is part of a larger string $\Phi$ of octets. The boundaries of x will have either even or odd octet addresses relative to the string $\Phi$. The octet address of the left boundary of x is defined as the octet address of the left-most octet of x. The octet address of the right boundary of x is defined as the octet address of the octet in $\Phi$ next to the right of the right-most octet in x. If the right-most octet in x is the right-most octet in $\Phi$, i.e., x is a tail segment of $\Phi$, then the address of the right boundary of x may be taken as 1 plus the octet address of the right-most octet in x. The convention taken here, for purposes of deriving an algorithm, is that the left-most octet in $\Phi$ has an even octet address. The left-most octet of $\Phi$ may be taken as starting at position zero. It is assumed that $\Phi$ has an even number of octets. In practice, packets are aligned on even boundaries, by padding if necessary, so that restricting $\Phi$ to an even number of octets is not limiting.

Let the function f(x) denote the even-octet-aligned checksum of the string segment x, defined as the checksum of the string y obtained by padding, if necessary, the head, tail, or both, of x with all-zero octets so that both of the boundaries of y are aligned at even octet addresses. Because $\Phi_A$ has an even number of octets, $$S_A = f(\Phi_A)$$

Because the first and last octets of $\Phi_A$ have even octet addresses, the left boundary of the head segment $\phi_0$ and the right boundary of the tail segment $\phi_2$ have even octet addresses. Consequently, using the associative property of $\oplus$ and the property that $$(\alpha_i|\alpha_j) = (\alpha_i|0) \oplus (0|\alpha_j), \qquad (1)$$

it follows that $$S_A = f(\Phi_A) = f(\phi_0) \oplus f(\phi_1) \oplus f(\phi_2)$$

The above property is verified by noting that the right boundary of $\phi_0$ and the left boundary of $\phi_0$ have the same address a, the right boundary of $\phi_1$ and the left boundary of $\phi_2$ have the same address b, and by considering the various combinations of even and odd values for a and b while making use of equation (1) and the associative property of $\oplus$.

Now consider the string $\Phi_B$. Because $\Phi_B$ has an even number of octets, $$S_B = f(\Phi_B).$$

Suppose the number of octets in the segments $\phi_1$ and $\hat{\phi}_1$ differ by an even amount. Then it is not necessary to append the all-zero octet to the tail segment $\phi_2$ when forming the string $\Phi_B$, so that $\Phi_B = (\phi_0|\hat{\phi}_1|\phi_2)$, and by similar reasoning as for the checksum of $\Phi_A$, $$S_B = f(\Phi_B) = f(\phi_0) \oplus f(\hat{\phi}_1) \oplus f(\phi_2).$$

From the above, it follows that $$S_B = (f(\phi_0) \oplus f(\phi_2)) \oplus f(\hat{\phi}_1) \qquad (2)$$
$$= (f(\Phi_A) \hat{\oplus} f(\phi_1)) \oplus f(\hat{\phi}_1)$$
$$= S_A \oplus (f(\hat{\phi}_1) \hat{\oplus} f(\phi_1)).$$

If the number of octets in the segments $\phi_1$ and $\hat{\phi}_1$ differ by an odd amount, then the all-zero octet needs to be appended to the tail segment $\phi_2$, so that $\Phi_B = (\phi_0|\hat{\phi}_1|\phi_2 0)$. By using the checksum string shifting property described earlier, it can be shown that $$S_B = f(\Phi_B) = f(\phi_0) \oplus f(\hat{\phi}_1) \oplus (f(\phi_2))'. \qquad (3)$$

Equations (2) and (3) provide expressions for $S_B$ in terms of the pre-computed checksum $S_A$ and checksums of various octet strings. The computational load used in equation (3) may be reduced by noting that $$f(\phi_0) = S_A \hat{\oplus} f(\phi_1) \hat{\oplus} f(\phi_2), \qquad (4)$$
$$f(\phi_2) = S_A \hat{\oplus} f(\phi_1) \hat{\oplus} f(\phi_0). \qquad (5)$$

Thus, assuming that the checksums $S_A$ and $f(\phi_1)$ have already been computed, if the octet string $\phi_0$ has smaller length than the octet string $\phi_2$, then the checksum $f(\phi_0)$ may be computed directly and the checksum $f(\phi_2)$ may be derived from equation (5). If the octet string $\phi_2$ has smaller length than the octet string $\phi_0$, then the checksum $f(\phi_2)$ may be computed directly and the checksum $f(\phi_0)$ may be derived from equation (4). If both octet strings $\phi_0$ and $\phi_2$ have the same length, then one or the other may be computed directly, and the other derived from the appropriate equation.

Figure 4:
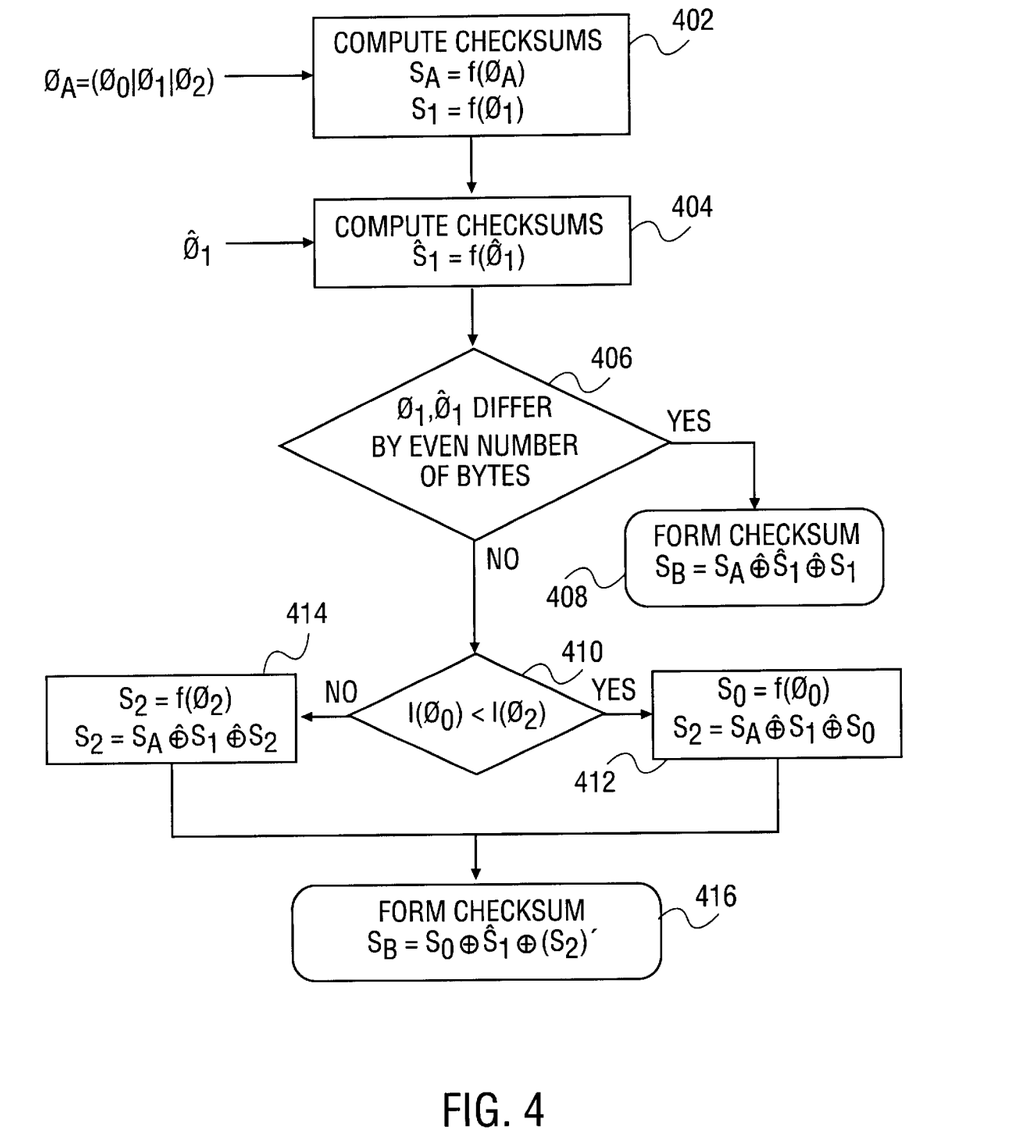
FIG. 4 illustrates a flow-diagram for an embodiment of the present invention.

An embodiment for computing the checksum $S_B$ is illustrated by the flow diagram of FIG. 4. For the octet string $\Phi_A = (\phi_0|\phi_1|\phi_2)$, block 402 computes checksums $S_A = f(\Phi_A)$ and $S_1 = f(\phi_1)$. For the new middle segment $\hat{\phi}_1$, block 404 computes the checksum $\hat{S}_1 = f(\hat{\phi}_1)$. Block 406 determines whether $\phi_1$ and $\hat{\phi}_1$ differ by an even or odd number of octets. For the former case, block 408 computes the checksum $S_B$ by forming the sum $S_B = S_A \oplus \hat{S}_1 \oplus S_1$, whereas for the latter case, control block 410 determines whether the number of octets in the string $\phi_0$ is less than the number of octets in the string $\phi_2$. If $l(\phi_0) \geq l(\phi_2)$, then block 412 computes the checksum $S_0 = f(\phi_0)$ and computes the checksum $S_2$ by forming the sum $S_2 = S_A \oplus S_1 \oplus S_0$, whereas if $l(\phi_0) \geq l(\phi_2)$, then block 414 computes the checksum $S_2 = f(\phi_2)$ and computes the checksum $S_0$ by forming the sum $S_0 = S_A \oplus S_1 \oplus S_2$. In block 416, the checksum $S_B$ is computed by forming the sum $S_B = S_0 \oplus \hat{S}_1 \oplus (S_2)'$.

Various modifications may be made to the disclosed embodiments without departing from the scope of the invention as claimed below.

I claim:

1. A method to propagate on a network signals indicative of a first packet and a second packet, the first packet comprising a first checksum for a first octet string comprising a middle segment, and the second packet comprising a second checksum for a second octet string comprising a new middle segment, the method comprising:

performing an even-octet-aligned checksum operation on the middle segment to provide a middle checksum;

performing an even-octet-aligned checksum operation on the new middle segment to provide a new middle checksum; and provided the middle and new middle octet strings differ in length by an even number of octets, performing checksum operations on the first checksum, the new middle checksum, and the middle checksum to provide the second checksum, wherein the checksum operation performed on the middle checksum is a checksum subtraction operation.

2. The method as set forth in claim 1, the first octet string comprising a head segment and a tail segment, the method further comprising, provided the middle and new middle octet strings differ in length by an odd number of octets:

provided the length of the head segment is less than the length of the tail segment, performing an even-octet-aligned checksum operation on the head segment to provide a head checksum, and performing checksum operations on the first checksum, the middle checksum, and the head checksum to provide a tail checksum, wherein the checksum operations performed on the middle checksum and the head checksum are checksum subtraction operations; and performing checksum operations on the head checksum, the new middle checksum, and a octet-swapped version of the tail checksum to provide the second checksum.

3. The method as set forth in claim 2, the method further comprising, provided the middle and new middle octet strings differ in length by an odd number of octets:

provided the length of the head segment is greater than the length of the tail segment, performing an even-octet-aligned checksum operation on the tail segment to provide the tail checksum, and performing checksum operations on the first checksum, the middle checksum, and the tail checksum, wherein the checksum operations performed on the middle checksum and the tail checksum are checksum subtraction operations.

4. The method as set forth in claim 1, wherein the first and second octet strings have even numbers of octets;

the second octet string is related to the first octet string by replacing the middle segment with the new middle segment to form a resulting octet string and appending an end of the resulting octet string with a zero octet if necessary so that the second octet string has an even number of octets; and the even-octet-aligned checksum operations and the checksum operations are 16-bit operations.

5. The method as set forth in claim 4, the first octet string comprising a head segment and a tail segment, the method further comprising, provided the middle and new middle octet strings differ in length by an odd number of octets:

provided the length of the head segment is less than the length of the tail segment, performing an even-octet-aligned checksum operation on the head segment to provide a head checksum, and performing checksum operations on the first checksum, the middle checksum, and the head checksum to provide a tail checksum, wherein the checksum operations performed on the middle checksum and the head checksum are checksum subtraction operations; and performing checksum operations on the head checksum, the new middle checksum, and a octet-swapped version of the tail checksum to provide the second checksum.

6. The method as set forth in claim 5, the method further comprising, provided the middle and new middle octet strings differ in length by an odd number of octets:

provided the length of the head segment is greater than the length of the tail segment, performing an even-octet-aligned checksum operation on the tail segment to provide the tail checksum, and performing checksum operations on the first checksum, the middle checksum, and the tail checksum, wherein the checksum operations performed on the middle checksum and the tail checksum are checksum subtraction operations.

7. An article of manufacture comprising a computer readable storage medium, the storage medium comprising instructions to program a processor to:

propagate on a network signals indicative of a first packet and a second packet, the first packet comprising a first checksum for a first octet string comprising a middle segment, and the second packet comprising a second checksum for a second octet string comprising a new middle segment;

perform an even-octet-aligned checksum operation on the middle segment to provide a middle checksum;

perform an even-octet-aligned checksum operation on the new middle segment to provide a new middle checksum; and provided the middle and new middle octet strings differ in length by an even number of octets, perform checksum operations on the first checksum, the new middle checksum, and the middle checksum to provide the second checksum, wherein the checksum operation performed on the middle checksum is a checksum subtraction operation.

8. The article of manufacture as set forth in claim 7, the first octet string comprising a head segment and a tail segment, the storage medium further comprising instructions to cause the processor to, provided the middle and new middle octet strings differ in length by an odd number of octets:

provided the length of the head segment is less than the length of the tail segment, perform an even-octet-aligned checksum operation on the head segment to provide a head checksum, and perform checksum operations on the first checksum, the middle checksum, and the head checksum to provide a tail checksum, wherein the checksum operations performed on the middle checksum and the head checksum are checksum subtraction operations; and perform checksum operations on the head checksum, the new middle checksum, and a octet-swapped version of the tail checksum to provide the second checksum.

9. The article of manufacture as set forth in claim 8, the storage medium further comprising instructions to cause the processor to, provided the middle and new middle octet strings differ in length by an odd number of octets:

provided the length of the head segment is greater than the length of the tail segment, perform an even-octet-aligned checksum operation on the tail segment to provide the tail checksum, and perform checksum operations on the first checksum, the middle checksum, and the tail checksum, wherein the checksum operations performed on the middle checksum and the tail checksum are checksum subtraction operations.

10. The article of manufacture as set forth in claim 7, wherein
the first and second octet strings have even numbers of octets;
the second octet string is related to the first octet string by replacing the middle segment with the new middle segment to form a resulting octet string and appending an end of the resulting octet string with a zero octet if necessary so that the second octet string has an even number of octets; and
the even-octet-aligned checksum operations and the checksum operations are 16-bit operations.

11. The article of manufacture as set forth in claim 10, the first octet string comprising a head segment and a tail segment, the storage medium further comprising instructions to cause the processor to, provided the middle and new middle octet strings differ in length by an odd number of octets:
provided the length of the head segment is less than the length of the tail segment, perform an even-octet-aligned checksum operation on the head segment to provide a head checksum, and perform checksum operations on the first checksum, the middle checksum, and the head checksum to provide a tail checksum, wherein the checksum operations performed on the middle checksum and the head checksum are checksum subtraction operations; and
perform checksum operations on the head checksum, the new middle checksum, and a octet-swapped version of the tail checksum to provide the second checksum.

12. The article of manufacture as set forth in claim 11, the storage medium further comprising instructions to cause the processor to, provided the middle and new middle octet strings differ in length by an odd number of octets:
provided the length of the head segment is greater than the length of the tail segment, perform an even-octet-aligned checksum operation on the tail segment to provide the tail checksum, and performing checksum operations on the first checksum, the middle checksum, and the tail checksum, wherein the checksum operations performed on the middle checksum and the tail checksum are checksum subtraction operations.

13. A communication network comprising:
a node; and
a network medium, wherein
the node is coupled to the network to propagate signals indicative of a first packet and a second packet, the first packet comprising a first checksum for a first octet string comprising a middle segment, and the second packet comprising a second checksum for a second octet string comprising a new middle segment, and wherein the node is coupled to the network to:
propagate on a network signals indicative of a first packet and a second packet, the first packet comprising a first checksum for a first octet string comprising a middle segment, and the second packet comprising a second checksum for a second octet string comprising a new middle segment;
perform an even-octet-aligned checksum operation on the middle segment to provide a middle checksum;
perform an even-octet-aligned checksum operation on the new middle segment to provide a new middle checksum; and provided the middle and new middle octet strings differ in length by an even number of octets, perform checksum operations on the first checksum, the new middle checksum, and the middle checksum to provide the second checksum, wherein the checksum operation performed on the middle checksum is a checksum subtraction operation.

14. The communication network as set forth in claim 13, the first octet string comprising a head segment and a tail segment, wherein the node is coupled to the network to, provided the middle and new middle octet strings differ in length by an odd number of octets:
provided the length of the head segment is less than the length of the tail segment, perform an even-octet-aligned checksum operation on the head segment to provide a head checksum, and perform checksum operations on the first checksum, the middle checksum, and the head checksum to provide a tail checksum, wherein the checksum operations performed on the middle checksum and the head checksum are checksum subtraction operations; and
perform checksum operations on the head checksum, the new middle checksum, and a octet-swapped version of the tail checksum to provide the second checksum.

15. The communication network as set forth in claim 14, wherein the node is coupled to the network to, provided the middle and new middle octet strings differ in length by an odd number of octets:
provided the length of the head segment is greater than the length of the tail segment, perform an even-octet-aligned checksum operation on the tail segment to provide the tail checksum, and perform checksum operations on the first checksum, the middle checksum, and the tail checksum, wherein the checksum operations performed on the middle checksum and the tail checksum are checksum subtraction operations.

16. A method to propagate on a network signals indicative of a first packet and a second packet, the first packet comprising a first checksum $S_A$ for a first octet string $\Phi_A=(\phi_0|\phi_1|\phi_2)$, where $\phi_0$, $\phi_1$ and $\phi_2$ are octet string segments, wherein $\Phi_A$ has an even number of octets, the second packet comprising a second checksum $S_B$ for a second octet string $$\Phi_B = \begin{cases} (\phi_0|\hat{\phi}_1|\phi_2) & \text{if number of bytes in } (\phi_0|\hat{\phi}_1|\phi_2) \text{ is even;} \\ (\phi_0|\hat{\phi}_1|\phi_2|0) & \text{if number of bytes in } (\phi_0|\hat{\phi}_1|\phi_2) \text{ is odd,} \end{cases}$$

where $\hat{\phi}_1$ is a octet string segment, the method comprising, where $f(\bullet)$ denotes an even-octet-aligned checksum:

forming an even-octet-aligned checksum $S_1=f(\phi_1)$;

forming an even-octet-aligned checksum $\hat{S}_1=f(\hat{\phi}_1)$;

provided $\phi_1$ and $\hat{\phi}_1$ differ in length by an even number of octets, forming the checksum $S_B$ by forming checksum operations $$S_B=S_A\oplus\hat{S}_1\hat{\oplus}S_1,$$

where $\oplus$ denotes 16-bit checksum summation and $\hat{\oplus}$ denotes 16-bit checksum subtraction.

17. The method as set forth in claim 16, further comprising, provided $\phi_1$ and $\hat{\phi}_1$ differ in length by an odd number of octets:

provided the length of $\phi_2$ is greater than the length of $\phi_0$, forming an even-octet-aligned checksum $S_0=f(\phi_0)$ and forming an even-octet-aligned checksum $S_2$ by forming checksum operations $$S_2=S_A \hat{\oplus} S_1 \hat{\oplus} S_0;$$

provided the length of $\phi_2$ is less than the length of $\phi_0$, forming an even-octet-aligned checksum $S_2=f(\phi_2)$ and forming an even-octet-aligned checksum $S_0$ by forming checksum operations $$S_0=S_A \hat{\oplus} S_1 \hat{\oplus} S_2;$$

forming the checksum $S_B$ by forming checksum operations $$S_B=S_0 \oplus \hat{S}_1 \hat{\oplus} (S_1)',$$

where $(\bullet)'$ denotes a octet-swapping operation.

* * * * *

UNITED STATES PATENT AND TRADEMARK OFFICE
CERTIFICATE OF CORRECTION

PATENT NO. : 6,732,329 B2
DATED : May 4, 2004
INVENTOR(S) : Bace

It is certified that error appears in the above-identified patent and that said Letters Patent is hereby corrected as shown below:

Column 1,
Line 47, delete "Corner," and insert -- Comer, --.

Column 3,
Line 67, delete "$\phi_0$" and insert -- $\phi_1$ --.

Column 4,
Line 27, delete "$\Phi_B = (\phi_0 \mid \hat{\phi}_1 \mid \phi_2 0)$." and insert -- $\Phi_B = (\phi_0 \mid \hat{\phi}_1 \mid \phi_2 \mid 0)$. --.

Line 51, delete "$\Phi_A = (\phi_0 \mid \phi_1 \mid \phi_2)$," and insert -- $\Phi_A = (\phi_0 \mid \phi_1 \mid \phi_2)$, --.
Line 59, delete "$l(\phi_0) \geqq l(\phi_2)$," and insert -- $l(\phi_0) < l(\phi_2)$, --.
Line 61, delete "$l(\phi_0) \geqq l(\phi_2)$," and insert -- $l(\phi_0) \geq l(\phi_2)$, --.

Signed and Sealed this

Sixth Day of July, 2004

JON W. DUDAS
*Acting Director of the United States Patent and Trademark Office*